United States Patent [19]

Tanaka

[11] Patent Number: 4,972,238
[45] Date of Patent: Nov. 20, 1990

[54] SEMICONDUCTOR LASER DEVICE

[75] Inventor: Akira Tanaka, Yokohama, Japan

[73] Assignee: Kabushiki Kaisha Toshiba, Kawasaki, Japan

[21] Appl. No.: 280,421

[22] Filed: Dec. 6, 1988

[30] Foreign Application Priority Data

Dec. 8, 1987 [JP] Japan .................. 62-308567

[51] Int. Cl.[5] ............................... H01L 33/00
[52] U.S. Cl. ........................ 357/17; 357/16;
357/56; 372/43; 372/44; 372/45; 372/46
[58] Field of Search .......... 357/4, 16, 17, 30 L,
357/30 G, 56, 30 B, 30 D, 30 E, 30 H, 30 L, 30
P, 30 R; 372/43, 44, 45, 46, 48

[56] References Cited

U.S. PATENT DOCUMENTS

| | | | |
|---|---|---|---|
| 4,426,702 | 1/1984 | Yamashita et al. | 357/17 |
| 4,566,171 | 1/1986 | Nelson et al. | 357/56 |
| 4,648,940 | 3/1987 | Menigaux et al. | 357/17 |
| 4,829,357 | 5/1989 | Kasahara | 357/17 |
| 4,847,573 | 7/1989 | Fukuzawa et al. | 357/17 |

FOREIGN PATENT DOCUMENTS

| | | | |
|---|---|---|---|
| 0208209 | 1/1987 | European Pat. Off. | 372/43 |
| 02326A1 | 1/1985 | Fed. Rep. of Germany | 372/43 |
| 0223182 | 11/1985 | Japan | 372/46 |
| 60-251686 | 12/1985 | Japan | 372/45 |
| 60-251689 | 12/1985 | Japan | 372/45 |
| 0084890 | 4/1986 | Japan | 372/43 |
| 0137386 | 6/1986 | Japan | 372/43 |
| 0015876 | 1/1987 | Japan | 372/46 |
| 0077979 | 3/1989 | Japan | 372/43 |

OTHER PUBLICATIONS

Applied Physics Letter, "Effect of Active Layer Placement of the Threshold Current of ...", N. K. Dutta et al., Aug. 1984, pp. 337-338.
Applied Physics Letter, "A New Lateral Selective-area Growth by Liquid-Phase Epitaxy: The Formation..." W. T. Tsang et al., Jun. 1982, p. 942.
Patent Abstracts of Japan, Nippon Denshin Denwa Kosha, vol. 10, NO. 117 (E-400) (2174) May 1986.
"Electronics Letters", vol. 20, No. 19, pp. 769-771.

*Primary Examiner*—Rolf Hille
*Assistant Examiner*—Minh Loan Tran
*Attorney, Agent, or Firm*—Cushman, Darby & Cushman

[57] ABSTRACT

A semiconductor laser device comprising a semiconductor substrate, a multi-layered mesa stripe having an active layer sandwiched between a semiconductor layer of the same conductivity type as that of the active layer and a semiconductor layer of the oppoiste conductivity type to that of the active layer, and formed on the substrate, a burying layer having a refractive index smaller than that of active layer and burying both sides of the mesa stripe, and a pair of electrodes for supplying a current to active layer. The mesa stripe is constructed such that both sides of active layer neighboring to the semiconductor layer of the opposite conductivity type substantially coninicide with those of the semiconductor layer, and that active layer has a width decreasing toward the boundary between active layer and semiconductor layer of the same conductivity type, thereby to form a waist portion at the boundary, and in that a protective layer is formed to fill the waist portion, thus covering at least both sides of the active layer.

7 Claims, 4 Drawing Sheets

SEMICONDUCTOR LASER DEVICE

BACKGROUND OF THE INVENTION

1. Field of the Invention

The present invention relates to a buried-heterostructure semiconductor laser device which achieves confinement of a current and optical wave-guiding, and also to a method of manufacturing the semiconductor laser device.

2. Description of the Related Art

Semiconductor lasers are increasingly used in optical disk devices such as digital audio-disk (DAD) devices, video-disk (VD) devices, and also in document filing systems. Also, they are used, in increasing numbers, as light sources in optical-fiber communication systems. At present, mode-controlled semiconductor lasers are in general use.

Buried-heterostructure semiconductor lasers are used not only as Fabry-Perot lasers, but also as distributed feedback lasers which have a layer for guiding optical waves. This is because the buried-heterostructure semiconductor laser can be operated efficiently with a relatively small threshold current since a current is confined to the active layer of this semiconductor laser.

FIG. 5 is a cross-sectional view showing a known GaInAsP buried-heterostructure semiconductor laser. This laser is manufactured in the following way.

First, several semiconductor layers are formed on n-(100) InP single-crystal substrate 70 by means of vapor-phase epitaxial growth, liquid-phase epitaxial growth (LPE), or metal organic chemical vapor deposition (MOCVD). More specifically, n-InP buffer layer 71 is formed on substrate 70; optical wave-guiding layer 72 is formed on buffer layer 71; GaInAsP active layer 73 is formed on layer 72; p-InP cladding layer 74 is formed on active layer 73; and p-GaInAsP ohmic layer 75 is formed on clad layer 74. Then, isotropic etching is performed on layers 71, 72, 73, 74, and 75, thereby removing these layers, except for their center portions. As a result of this, a mesa stripe 76 remains on n-(100) InP single-crystal substrate 70. Next, burying layers, which consist of p-InP layer 77 and n-InP layer 78, are formed on the substrate 70. Further, GaInAsP cap layer 79 is formed on the burying layers. Layers 77, 78, and 79 are formed by the same method as the layers of mesa stripe 76. As a result, a buried-heterostructure semiconductor laser is made which has a flat and smooth upper surface because of cap layer 79.

During the process of forming the burying layers (layers 77 and 78) and cap layer 79, mesa stripe 76 is exposed to intense heat for a specific period of time. The heat inevitably damages stripe 76. The thermal damage to active layer 73 may either result in an increase of a leakage current, or deteriorate the operating characteristics of this semiconductor laser.

A buried-heterostructure semiconductor laser of another type is disclosed in Japanese Patent Disclosure No. 60-251687. FIG. 6 illustrates this semiconductor laser. (In this figure, the same numerals designate the same elements as those shown in FIG. 5). As is shown in FIG. 6, the edge portions 80 of active layer 73 are selectively etched and then buried by virtue of mass-transport phenomenon. The exposed edges 81 of active layer 73 are buried by virtue of mass transport. Hence, edges 81 are free from thermal damages which they would otherwise suffer during the process of forming the burying layers. However, positive junction 82 is formed between the mass-transport sections which sandwich active layer 73. Due to this junction 82, part of the current supplied from electrode 83 to electrode 84 does not flow through active layer 73, but via mass-transport sections. In other words, a leakage current increases, and the current cannot be sufficiently confined to active layer 73.

SUMMARY OF THE INVENTION

Accordingly, it is an object of the present invention to provide a semiconductor laser device which has an active layer not thermally damaged during the forming of a burying layer, and has thus good operating characteristics, in which the leakage current is reduced to a minimum, and which is therefore greatly efficient and highly reliable.

Another object of the present invention is to provide a method of manufacturing a semiconductor laser device having the above-mentioned features.

According to the present invention, there is provided a semiconductor laser device which comprises: a semiconductor substrate; a multi-layered mesa stripe having a first semiconductor layer of a first conductivity type formed on the substrate, an active layer of the first conductivity type formed on the first semiconductor layer, and a second semiconductor layer of a second conductivity type formed on the active layer, the cross section of the mesa stripe, perpendicular to the axis of the mesa stripe, being constructed such that both sides of the active layer neighboring to the second semiconductor layer substantially coincide with those of the second semiconductor layer, and that the active layer has a width decreasing toward the boundary between the active layer and the first semiconductor layer thereby to form a waist portion at the boundary between the active layer and the first semiconductor layer; a protective layer formed to fill the waist portion of the mesa stripe, thus covering at least both sides of the active layer; a burying layer having a refractive index smaller than that of the active layer and burying sides of the mesa stripe and the protective layer; a pair of electrodes for supplying a current to the active layer. Also, according to the present invention, there is provided a method of manufacturing a semiconductor laser device, comprising the steps of:

(i) forming, on a semiconductor substrate, a first semiconductor layer of a first conductivity type, an active layer of the first conductivity type on the first semiconductor layer, and a second semiconductor layer of a second conductivity type on the active layer, thereby forming a multi-layer structure of semiconductor material;

(ii) etching the multi-layer structure of semiconductor material, thus forming a mesa stripe, the cross section of the mesa stripe, perpendicular to the axis of the mesa stripe, being constructed such that both sides of the active layer neighboring to the second semiconductor layer substantially coincide with those of the second semiconductor layer, and that the active layer has a width decreasing toward the boundary between the active layer and the first semiconductor layer thereby forming a waist portion at the boundary between the active layer and the first semiconductor layer;

(iii) forming a protective layer to fill the waist portion of the mesa stripe, thus covering at least both exposed sides of the active layer;

(iv) forming a burying layer having a refractive index smaller than that of the active layer to bury sides of the mesa stripe and the protective layer; and (v) forming a pair of electrodes for supplying a current to the active layer.

The first semiconductor layer, which is of the same conductivity type as the active layer, is comprised of a buffer layer and an optical wave-guiding layer which are sequentially formed on the substrate. Alternatively, the first semiconductor layer can be either a buffer layer or an optical wave-guiding layer, formed on the substrate.

The second semiconductor layer having a conductivity type different to that of the active layer, can either be a cladding layer or a layer including a cladding layer. The cladding layer can have a waist portion which is located near the active layer.

The protective layer protects the active layer from thermal damages during the heat treatment for forming the burying layer, and serves to minimize a leakage current. It is made of either a semiconductor material or an insulative material. It is desirable that the protective layer is formed by virtue of mass-transport phenomenon.

The burying layer is made of a semiconductive material or a high-resistance material, either having a refractive index less than that of the active layer.

Since the sides of the active layer is protected against thermal damages during the heating process for forming the burying layer, the degradation of the laser device according to the invention would not be caused to occur. In addition, the leakage current of the laser device is minimized, and the laser device can, therefore, operate reliably with a small threshold current.

DETAILED DESCRIPTION OF THE PREFERRED EMBODIMENTS

Figure 1A:
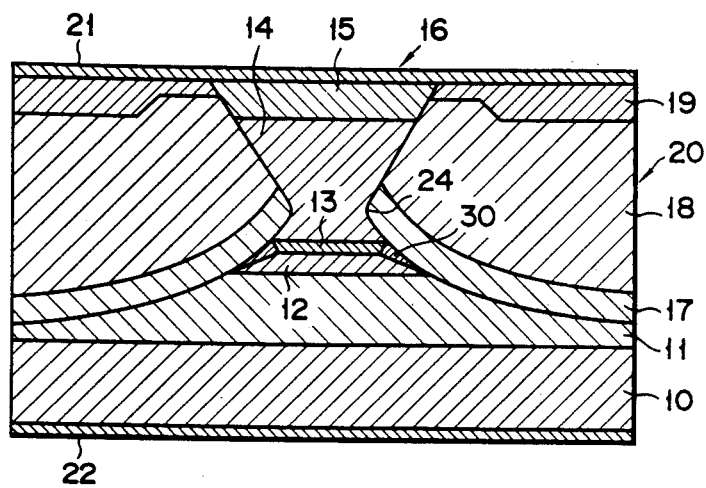
FIG. 1A is a cross-sectional view showing an embodiment of the present invention.
Figure 1B:
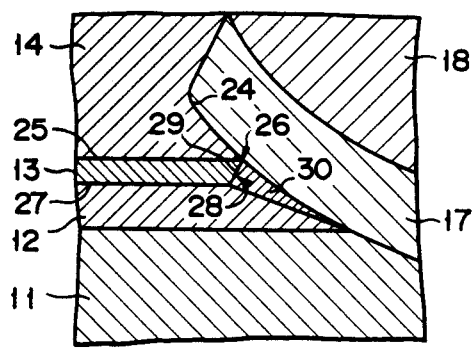
FIG. 1B is an enlarged, cross-sectional view showing part of the embodiment shown in FIG. 1A.

FIGS. 1A and 1B show a buried-heterostructure semiconductor laser according to the present invention. More precisely, FIG. 1A is a cross-sectional view of an emitting facet of the laser, and FIG. 1B is an enlarged view illustrating main part of the laser shown in FIG. 1A.

As is shown in FIGS. 1A and 1B, n-InP buffer layer 11 is formed on the upper surface of n-InP substrate 10. n-GaInAsP optical wave-guiding layer 12 is formed on buffer layer 11, n-GaInAsP active layer 13 is formed on optical wave-guiding layer 12, p-InP cladding layer 14 is formed on active layer 13, and p-GaInAsP ohmic layer 15 of high conductivity is formed on cladding layer 14. Buffer layer 11 and cladding layer 14 have a relatively low refractive index, whereas active layer 13 has a relatively high refractive index. These layers 11, 12, 13, 14, and 15 constitute mesa stripe 16 extending in the direction in which the laser emits a beam. Both sides of mesa stripe 16 are covered with burying layer 20 having a low refractive index. As is evident from FIG. 1A, burying layers 20 consist of p-InP layer 17, n-InP layer 18, and GaInAsP cap layer 19. Further, a pair of electrodes 21 and 22 are provided for supplying a current into active layer 13. Electrode 21 is formed on ohmic layer 15, and electrode 22 is formed on the lower surface of n-InP substrate 10.

As can be understood from FIG. 1A, the cross section of mesa stripe 16 is an inverted mesa, with its width reducing from cladding layer 14 toward buffer layer 11. Cladding layer 14 has waist 24 which is narrower than any other portion of layer 14 and located near active layer 13. That portion of cladding layer 14 which is below waist 24 flares toward boundary 25 between active layer 13 and cladding layer 14. The lower surface of cladding layer 14 has the same width as the upper surface of active layer 13, and both sides of cladding layer 14 therefore coincide with those of active layer 13. The width of active layer 13 decreases toward the boundary 27 between layer 13 and optical wave-guiding layer 12. In other words, both sides of active layer 13 are inclined such that its cross section is shaped like an inverted mesa. Hence, mesa stripe 16 has waist 28 at boundary 27. Two V-grooves, the bottoms of which are boundary 27, are formed between active layer 13, optical wave-guiding layer 12. Protective layers 30 made of mainly InP are formed within the V-grooves.

The exposes sides of mesa stripe 16 contact burying layers 20. The sides of active layer 13 are covered with protective layers 30 and thus do not contact burying layer 20, except for boundary 26 with cladding layer 14.

It will now be explained how the semiconductor laser shown in FIGS. 1A and 1B is manufactured, with reference to FIGS. 2A, 2B, and 2C which are perspective views of half-finished structures of the semiconductor laser in each manufacturing step.

Figure 2A:
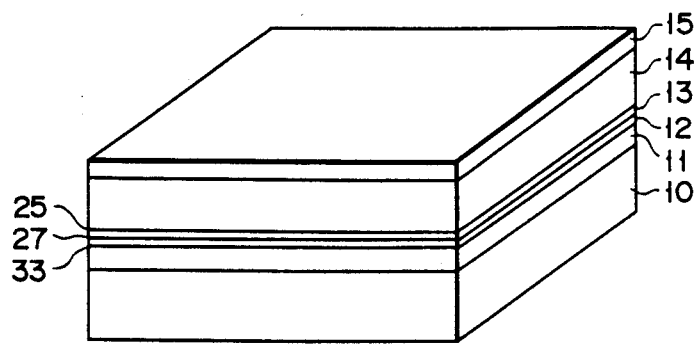
FIGS. 2A, 2B, and 2C are perspective views, illustrating in sequence how the semiconductor laser device according to the embodiment shown in FIG. 1A can be manufactured.

First, as is shown in FIG. 2A, n-InP buffer layer 11 having a thickness of 2 $\mu$m is formed on n-(100) InP substrate 10 by means of liquid-phase epitaxial growth. Thereafter, n-GaInAsP optical wave-guiding layer 12 having a thickness of 0.15 $\mu$m is formed on buffer layer 11. Next, GaInAsP active layer 13 having a thickness of 0.15 $\mu$m is formed on layer 12, thus forming a heterojunction, jointly with layer 12. Active layer 13 has the same lattice constant as that of InP. It is an n$^-$ layer and has a refractive index greater than that of optical wave-guiding layer 12 and that of cladding layer 14. Then p-InP cladding layer 14 is formed on active layer 13. As a result, active layer 13 is sandwiched between optical wave-guiding layer 12 and cladding layer 14. Next, p-GaInAsP ohmic layer 15 is formed on cladding layer 14. The total thickness of cladding layer 14 and ohmic layer 15 is 2.5 $\mu$m.

Figure 2B:
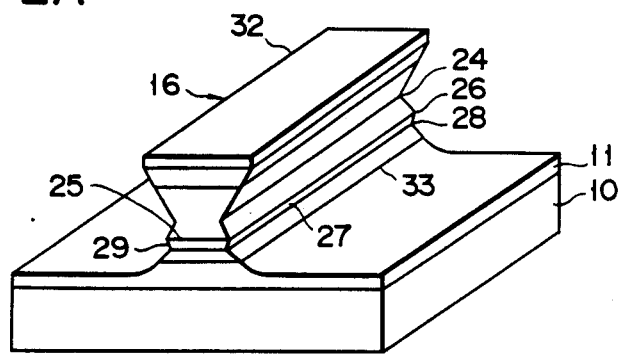
Figure 2C:
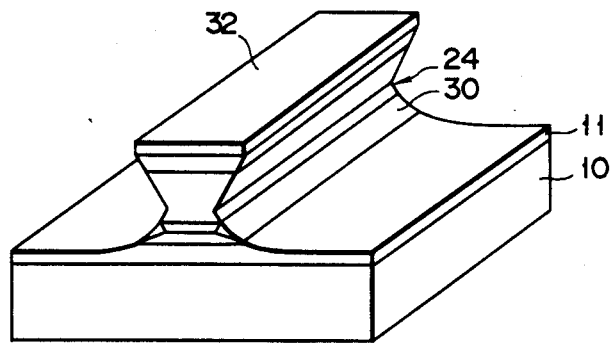

Thereafter, as is illustrated n FIG. 2B, semiconductor layers 11 to 15 are etched with bromine-methanol etchant, by using a SiO$_2$ mask 32 patterned by photoetching, thereby forming mesa stripe 16 which extends along <011> axis of substrate 10 to a length of about 0.3 mm. This mesa stripe 16 is shaped like a dovetail-shaped mesa. As is shown in FIG. 2B, cladding layer 14 has waist 24 having a width of about 1 $\mu$m, and mesa stripe 16 has waist 28 at boundary 27 between optical wave-guiding layer 12 and active layer 13. Waist 28 is broader than waist 24 of cladding layer 14.

Waists 24 and 28 are formed by the following process. The etching rate of a semiconductor layer depends upon its direction of crystal plane. In the case of a direction of the mesa stripe being that of <011> axis, the etching speed is lowered as the (111)A plane is exposed. No noticeable difference in etching rate is found among semiconductor layers of different crystal compositions. Therefore, cladding layer 14 has its width gradually reduced toward its lower end, and its cross section will be shaped like a dovetail-shaped mesa. Accordingly, it is possible to form waist 28 at or near the boundary 27 between active layer 13 and optical wave-guiding layer 12 owing to a difference in etching rate between these layers 13 and 14, together with cladding layer's waist 24 formed in the thick cladding layer 14, by stopping the etching process when a (111)A plane (where In is exposed) is exposed in the side surface portion of the cladding layer 14 near the active layer 13.

It will be described in greater detail how waist 28 is made at boundary 27 between optical wave-guiding layer 12 and active layer 13. Active layer 13 has a refractive index lower than that of optical wave-guiding layer 12, which in turn has a refractive index lower than that of cladding layer 14. Conversely, an etching rate of an active layer 13 is higher than that of optical wave-guiding layer 12, which in turn has an etching rate higher than that of cladding layer 14. The etching rate of boundary 25 between active layer 13 and cladding layer 14 depends on that of cladding layer 14; and the etching rate of boundary 33 between optical wave-guiding layer 12 and buffer layer 11 depends on that of buffer layer 11. Therefore, the etching rate of boundary 27 between active layer 13 and optical wave-guiding layer 12 is higher than those of boundaries 25 and 33. Hence, it is at this boundary 27 that waist 28 is formed, defining V-shaped grooves.

At boundary 25, active layer 13 and cladding layer 14 contact together at their entire surfaces. Boundary 25 forms two projections 26 having a protruded triangular cross section and extending horizontally. Sides 29 of active layer 13 are inclined such that the width of layer 13 decreases toward boundary 27. These sides 29 have a plane similar to (111)A plane. Inclined sides 29 define V-grooves whose depth is almost equal to the thickness of active layer 13.

The structure shown in FIG. 2B gradually changes in a phosphorus-containing atmosphere as temperature becomes high in order to soak before the LPE growth process of the burying layers. During the soak time, for example two hours at 670° C., protective layers 30 made of mainly InP are formed in the V-grooves formed at waist 28, as is shown in FIG. 2C. These burying layers have been formed by virtue of mass transport phenomenon, covering the exposed sides 29 of active layer 13, and hence function as protective layers of active layer 13.

After the soak time, the cooling starts at the rate of 0.8° C. per minute. When the temperature becomes 630° C., p-InP layer 17 is formed by LPE, covering the exposed sides of layers 30 and the exposed sides of the lower portion of cladding layer 14, as is illustrated in FIGS. 1A and 1B. Then, n-InP layer 18 is formed on layer 17, covering the exposed sides of the upper portion of cladding layer 14 and also the exposed sides of p-GaInAsP ohmic layer 15, as is shown in FIG. 1A. Further, cap layer 19 is formed on n-InP layer 18 in order to smooth the surface. Then, SiO$_2$ mask 32 is removed from ohmic layer 15. Electrodes 21 and 22, both made of an Au alloy, are deposited on the upper and lower surfaces of the structure, as is illustrated in FIG. 1A. Thus, a buried-heterostructure semiconductor laser is manufactured.

In the process of manufacturing the semiconductor laser of InP/GaInAsP system, the LPE growth is generally carried out at a temperature ranging from 550° to 650° C., thereby forming layers 17, 18, and 19. While these layers are growing, the semiconductor elements of the laser are exposed to intense heat. Nonetheless, active layer 13 is little damaged thermally since it is protected by protective layers 30. Active layer 13 can, therefore, perform its function reliably. Protective layer 30 may grow so much as to cover not only optical wave-guiding layer 12 and active layer 13, but also the sides of buffer layer 11 and the sides of cladding layer 14, in accordance with the shape of mesa stripe 16 and also the conditions for forming layers 30, such as the temperature, the heating time, and the partial pressure of phosphorus. However, since the thickness of protective layer 30 is far less than 1 μm, i.e., the width of active layer 13, it will not cause any current leakage problem. In another word, if the thickness of the protruded portion of protective layer 30 is controlled to be no more than that of active layer 13, any current leakage can be neglected.

Only one semiconductor laser is shown in FIG. 1A and FIGS. 2A, 2B, and 2C. In practice, a number of semiconductor lasers are simultaneously formed on the same wafer, and are finally separated from one another, in the form of chips.

As has been described, layers 30 protect active layer 13 from thermal damages during the process of forming layers 17, 18, and 19. In addition, no junction is formed since protective layers 30 are interposed between optical wave-guiding layer 12 and active layer 13 which are of the same conductivity type. This also helps to reduce the current leakage to a minimum. Moreover, virtually no current flows through protective layer 30 since boundary 26 between active layer 13 and cladding layer 14 contacts burying layer 17. The operation current, which has been confined at waist 24 of cladding layer 14, flows in its entirety through active layer 13.

Figure 3:
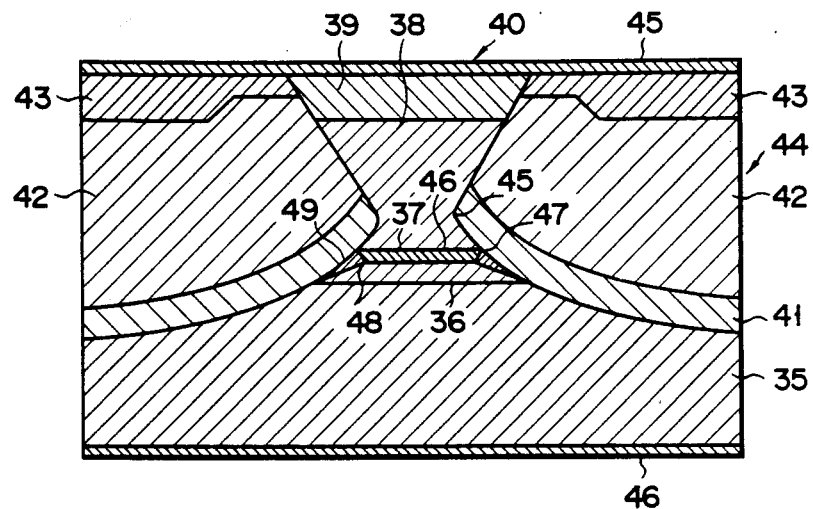
FIG. 3 is a cross-sectional view showing another embodiment of the present invention.

FIG. 3 shows another embodiment of the present invention, wherein an optical wave-guiding layer performs the function of a buffer layer as well. More specifically, n-GaInAsP optical wave-guiding layer 36, which has a thickness of 0.1 to 0.2 μm, has a relatively low refractive index, and functions as a buffer layer, too, is formed on the upper surface of n-InP substrate, on which a diffraction grating has been formed. Further, n-GaInAsP active layer 37, which has a thickness of 0.1 to 0.2 μm and a relatively high refractive index, is formed on optical wave-guiding layer 36. P-InP cladding layer 38 having a relatively low refractive index is formed on active layer 37, and p-GaInAsP ohmic layer 39 having a high conductivity is formed on cladding layer 38. These layers 36, 37, 38, and 39 are etched, thereby forming mesa stripe 40 which extends in the direction in which the semiconductor laser emits a beam. Both sides of mesa assembly 40 are covered with burying layers 44 having a relatively low refractive index and a high resistance. Burying layers 44 consist of p-InP layer 41, n-InP layer 42 and GaInAsP cap layer 43. Electrode 45 is formed on ohmic layer 39, and electrode 46 is formed on the lower surface of substrate 35.

As is evident from FIG. 3, the cross section of mesa stripe 40 is a dovetail-shaped mesa, with its width reducing from cladding layer 38 toward optical wave-guiding layer 36. Cladding layer 38 has waist 45 which is narrower than any other portion of layer 38 and located near active layer 37. That portion of cladding layer 38 which is below waist 45 flares toward boundary 46 between active layer 37 and cladding layer 38. The lower surface of cladding layer 38 has the same width as the upper surface of active layer 37, and both sides of cladding layer 38 are therefore continuous with those of active layer 37. The width of active layer 37 decreases toward the boundary between layer 37 and optical wave-guiding layer 36. In other words, both sides of active layer 37 are inclined such that its cross section is shaped like a dovetail-shaped mesa. Hence, mesa stripe 40 has waist 48 at the boundary between optical wave-guiding layer 36 and active layer 37. Two V-grooves, the bottoms of which are this boundary, are formed between active layer 37, optical wave-guiding layer 36, and the lower surface of p-InP layer 41. Protective layers 49 made of mainly InP are formed within the V-grooves.

Both exposed sides of mesa stripe 40 contact burying layer 44, but the sides of active layer 37 are isolated from burying layer 44 by protective layers 49, except for the edges at boundary 47. Since optical wave-guiding layer 36 performs the function of buffer layer, too, this semiconductor laser is more simple in structure than the laser shown in FIGS. 1A and 1B. As in the case of the first embodiment (FIGS. 1A and 1B), active layer 37 is unlikely to be damaged since it is not directly exposed to intense heat during the process of forming burying layers 44, and leakage current flow through protective layer 49 will be substantially eliminated.

A buried-heterostructure distributed feedback semiconductor laser described above was tested. The results were that the laser, which has a stripe length of 300 μm and both cleaned facets, emitted a beam at room temperature with a relatively small threshold current of 6 mA.

Figure 4:
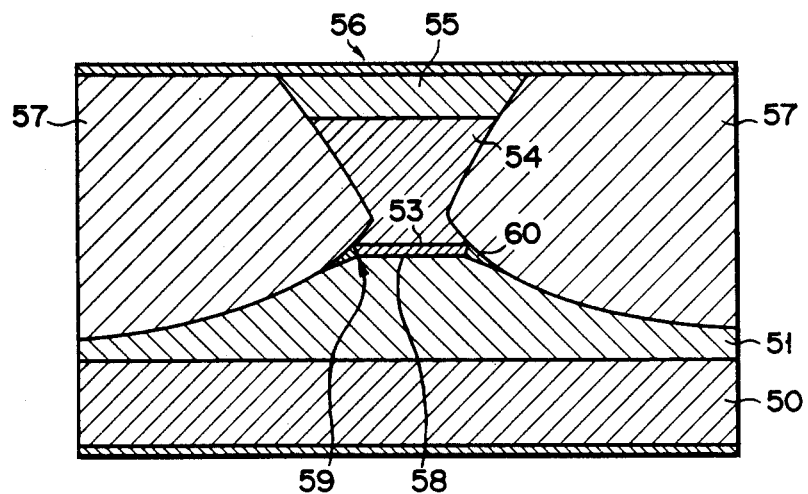
FIG. 4 is a cross-sectional view showing a further embodiment of the present invention.
Figure 5:
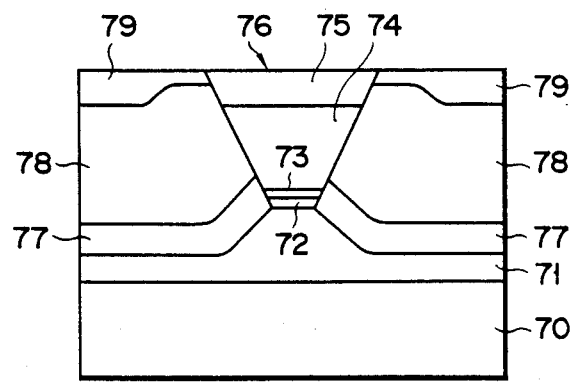
FIG. 5 is a cross-sectional view showing a conventional semiconductor laser device.
Figure 6:
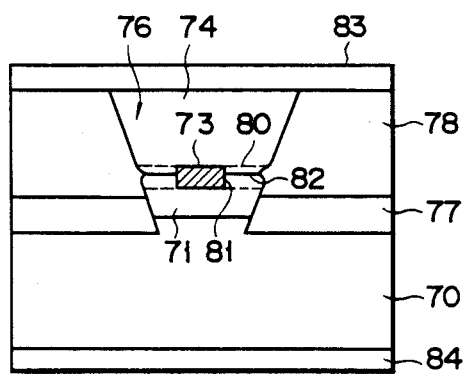
FIG. 6 is a cross-sectional view showing another conventional semiconductor laser device.

FIG. 4 shows still another embodiment of the present invention which is different from the first embodiment (FIGS. 1A and 1B) in two respects. First, it has no optical wave-guiding layers. Secondly, its substrate is of the opposite conductivity type, i.e., p type. As is clearly shown in FIG. 4, thick p-InP buffer layer 51 is formed on p-InP substrate 50. P-GaInAsP active layer 53, which has a relatively high refractive index, is formed on buffer layer 51. N-InP cladding layer 54, which has a comparatively low refractive index, is formed on active layer 53. N-GaInAsP ohmic layer 55, which is highly conductive, is formed on cladding layer 54. Layers 53, 54, and 55 are etched, thus forming mesa stripe 56 which extends in the direction in which the semiconductor laser emits a beam. Both sides of mesa stripe 56 are covered with burying layer 57 having a relatively low refractive index and a high resistance. One electrode is formed on ohmic layer 55 and burying layer 57, and another electrode is formed on the lower surface of n-InP substrate 50.

Mesa stripe 56 has waist 59 at the boundary 58 between buffer layer 51 and active layer 53. Two V-grooves, the bottoms of which are boundary 58, are formed between active layer 53 and buffer layer 51. Protective layers 60 are formed in the V-grooves by virtue of mass transport, thus protecting the sides of active layer 53 from intense heat during the process of forming burying layer 57. As in the case of the first embodiment, no prominent leakage current flows through protective layer 60, whereby the leakage current is minimized in this semiconductor laser. Protective layers 60 are made of semiconductor material in this instance. Nonetheless, they can be made of an insulative material such as $SiO_2$ if they are formed by means other than mass transport. Burying layer 57 can also be made of an insulative material such as $SiO_2$. The third embodiment shown in FIG. 4 can be used as Fabry-Perot semiconductor laser and can operate with a relatively small threshold current.

As has been described above, any semiconductor laser according to the present invention has protective layers which cover both exposed sides of the active layer, so that the cladding layer, the buffer layer or the optical wave-guiding layer, which sandwich the active layer, is not short-circuited to each other. The protective layers protect the sides of the active layer from thermal damages during the process of forming the burying layer. Furthermore, since its leakage current is minimized, the semiconductor laser of the invention can perform its function at room temperature, with a small threshold current.

What is claimed is:

1. A buried-heterostructure semiconductor laser device comprising:
    a semiconductor substrate;
    a multi-layered mesa stripe having a first semiconductor layer of a first conductivity type formed on said substrate, an active layer of the first conductivity type formed on said first semiconductor layer, and a second semiconductor layer of a second conductivity type formed on said active layer, the cross section of said mesa stripe, perpendicular to an axis of said mesa stripe, being constructed such that both sides of said active layer neighboring to the second semiconductor layer substantially coincide with those of said second semiconductor layer, and that said active layer has a width decreasing toward a boundary between said active layer and said first semiconductor layer thereby forming a waist portion at the boundary between said active layer and said first semiconductor layer;
    a protective layer of semiconductor material formed by mass transport phenomenon and filling the waist portion of said mesa stripe, thus covering at least both sides of the active layer;
    a burying layer having a refractive index smaller than that of said active layer and burying sides of mesa stripe and said protective layer; and
    a pair of electrodes for supplying a current to said active layer.

2. The semiconductor laser device according to claim 1, wherein said first semiconductor layer is comprised of a buffer layer formed on said substrate and an optical wave-guiding layer formed on the buffer layer, said waist portion is formed at the boundary between said active layer and said optical wave-guiding layer, and said second semiconductor layer includes a cladding layer.

3. The semiconductor laser device according to claim 1, wherein said cladding layer has a width gradually decreasing toward said active layer, and has a waist located near said active layer.

4. The semiconductor laser device according to claim 1, wherein said first semiconductor layer comprises a buffer layer formed on said substrate.

5. The semiconductor laser device according to claim 1, wherein said first semiconductor layer comprises an optical wave-guiding layer formed on said substrate.

6. The semiconductor laser device according to claim 1, wherein said burying layer is made of semiconductor material.

7. The semiconductor laser device according to claim 1, wherein said burying layer is made of high-resistance material.

* * * * *